United States Patent
Ito et al.

(10) Patent No.: US 9,773,712 B2
(45) Date of Patent: Sep. 26, 2017

(54) ION IMPLANTATION APPARATUS AND SEMICONDUCTOR MANUFACTURING METHOD

(71) Applicant: Toshiba Memory Corporation, Minato-ku (JP)

(72) Inventors: Takayuki Ito, Yokkaichi (JP); Yasunori Oshima, Yokkaichi (JP); Toshihiko Iinuma, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/956,944

(22) Filed: Dec. 2, 2015

(65) Prior Publication Data

US 2017/0062285 A1    Mar. 2, 2017

Related U.S. Application Data

(60) Provisional application No. 62/209,480, filed on Aug. 25, 2015.

(51) Int. Cl.
*H01J 37/317* (2006.01)
*H01L 21/66* (2006.01)
(Continued)

(52) U.S. Cl.
CPC ............ *H01L 22/26* (2013.01); *H01J 37/244* (2013.01); *H01J 37/3171* (2013.01);
(Continued)

(58) Field of Classification Search
USPC ...................................... 250/492.3
See application file for complete search history.

(56) References Cited

U.S. PATENT DOCUMENTS 4,922,106 A * 5/1990 Berrian ............... H01J 37/3171
250/398
6,300,642 B1 * 10/2001 Cho ...................... H01J 37/304
250/397

(Continued)

FOREIGN PATENT DOCUMENTS

| JP | 2012-109570 | 6/2012 |
| JP | 2012-178571 | 9/2012 |
| JP | 2014-110142 | 6/2014 |

*Primary Examiner* — Phillip A Johnston
(74) *Attorney, Agent, or Firm* — Oblon, McClelland, Maier & Neustadt, L.L.P.

(57) ABSTRACT

An ion implantation apparatus includes an implantation part, a measuring part, and a controller. The ion implantation part implants ions into an implantation region located at a bottom of a concave portion provided on a semiconductor substrate. The measuring part measures an implantation amount of ions corresponding to an aspect ratio of the concave portion based on ions implanted from the implantation part thereinto, at a first position at which the semiconductor substrate is arranged when the ions are implanted into the implantation region or a second position close to the first position. The controller controls the implantation part to stop implantation of the ions into the measuring part when an accumulated amount of the implantation amount has reached a predetermined amount according to a target accumulation amount of the implantation region.

15 Claims, 9 Drawing Sheets

(51) Int. Cl.
*H01L 21/265* (2006.01)
*H01J 37/244* (2006.01)

(52) U.S. Cl.
CPC ........ *H01L 21/26513* (2013.01); *H01L 22/14* (2013.01); *H01J 2237/24405* (2013.01); *H01J 2237/24528* (2013.01); *H01J 2237/24542* (2013.01); *H01J 2237/31703* (2013.01)

(56) References Cited

U.S. PATENT DOCUMENTS

| | | | |
|---|---|---|---|
| 6,300,643 B1 | 10/2001 | Fang et al. | |
| 6,723,998 B2 * | 4/2004 | Bisson | H01J 37/244 250/397 |
| 7,385,207 B2 * | 6/2008 | Yoon | G01N 23/00 250/397 |
| 7,396,746 B2 | 7/2008 | Walther et al. | |
| 7,429,741 B2 * | 9/2008 | Park | H01J 37/244 250/397 |
| 7,561,983 B2 * | 7/2009 | Gupta | H01J 37/304 702/123 |

* cited by examiner

ION IMPLANTATION APPARATUS AND SEMICONDUCTOR MANUFACTURING METHOD

CROSS REFERENCE TO RELATED APPLICATIONS

This application is based upon and claims the benefit of priority from the prior U.S. Provisional Patent Application No. 62/209,480 filed on Aug. 25, 2015, the entire contents of which are incorporated herein by reference.

FIELD

Embodiments relate to an ion implantation apparatus and a semiconductor manufacturing method.

BACKGROUND

In a manufacturing process of a semiconductor apparatus having a three-dimensional memory cell structure, a laminated film including an oxide film, a silicon nitride film, and the like is formed on a well and thereafter a concave portion having a high aspect ratio, such as a slit or a via hole, is formed in the laminated film to reach the well. The aspect ratio is the ratio of a width and a depth of the concave portion, that is, a value obtained by dividing the depth by the width. Ions as impurities are then implanted by an ion implantation apparatus into the well located on the bottom of the concave portion, so that an impurity diffusion layer is formed. In the formation of the diffusion layer, an implantation amount (dose) of ions is measured with a Faraday cup. When an accumulated amount of the implantation amount has reached a predetermined amount, ion implantation is terminated.

When an aspect ratio is high, the range of an implantation angle of ions within which ions can reach the bottom of the concave portion is narrower than when the aspect ratio is low. The implantation angle is determined by a tilt angle that is an inclination of a surface normal of a wafer with respect to a beam axis (a center) of an ion beam, beam-axis deviation that is deviation of the beam axis from the center of the wafer, a beam angular dispersion that is dispersion of the ion beam from the beam axis (a divergence angle), and the like.

Because of the narrow range of the implantation angle within which ions can reach the bottom of the concave portion, the accuracy of the implantation angle largely affects the measurement accuracy of the Faraday cup when the aspect ratio is high. Specifically, in a case where the accuracy of the implantation angle is poor, an implantation amount of ions actually implanted to the bottom of the concave portion is not accurately reflected on the implantation amount measured with the Faraday cup. In this case, a semiconductor apparatus having a diffusion layer formed based on a measurement result of the Faraday cup may not exhibit a desired performance.

Therefore, it is required to accurately measure an implantation amount of ions implanted to the bottom of the concave portion in order to manufacture a semiconductor apparatus having a concave portion with a high aspect ratio with a stable yield.

DETAILED DESCRIPTION

An ion implantation apparatus according to an embodiment includes an implantation part, a measuring part, and a controller. The ion implantation part implants ions into an implantation region located at a bottom of a concave portion provided on a semiconductor substrate. The measuring part measures an implantation amount of ions corresponding to an aspect ratio of the concave portion based on ions implanted from the implantation part thereinto, at a first position at which the semiconductor substrate is arranged when the ions are implanted into the implantation region or a second position close to the first position. The controller controls the implantation part to stop implantation of the ions into the measuring part when an accumulated amount of the implantation amount has reached a predetermined amount according to a target accumulation amount of the implantation region.

Embodiments will now be explained with reference to the accompanying drawings. The present invention is not limited to the embodiments.

First Embodiment

Figure 1:
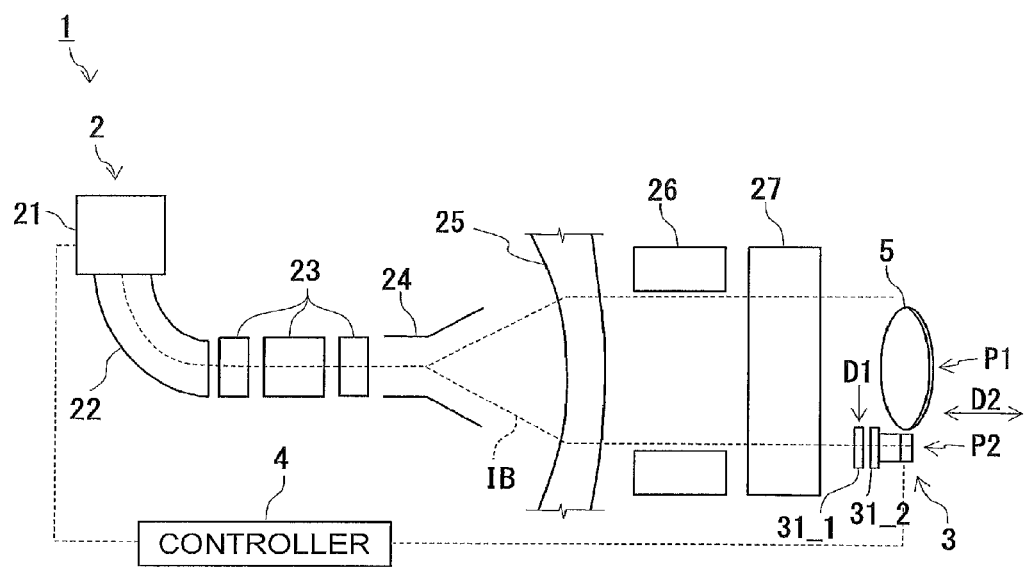
FIG. 1 is a schematic plan view of an ion implantation apparatus according to a first embodiment.
Figure 2:
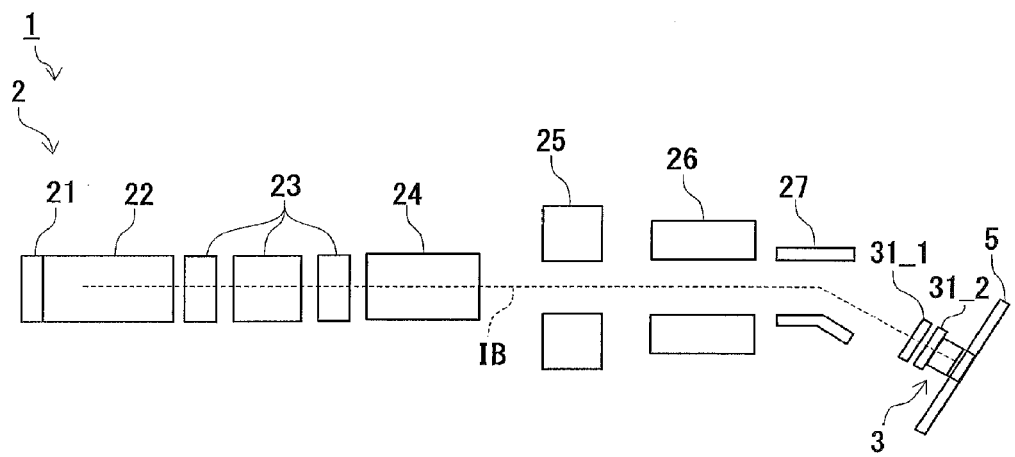
FIG. 2 is a schematic side view of the ion implantation apparatus according to the first embodiment.

First, an embodiment in which an implantation amount corresponding to an aspect ratio is measured by using a collimator when ions are implanted into an implantation region is described as a first embodiment. FIG. 1 is a schematic plan view of an ion implantation apparatus according to the first embodiment. FIG. 2 is a schematic side view of the ion implantation apparatus according to the first embodiment. As shown in FIGS. 1 and 2, an ion implantation apparatus 1 includes an implantation part 2, a measuring part 3, and a controller 4.

(Implantation Part 2)

The implantation part 2 includes an ion source 21, an analyzer 22, a Q lens 23, a scanner 24, a parallel lens 25, a post-stage acceleration/deceleration electrode 26, and an energy filter 27 in that order along a traveling direction of an ion beam IB.

The ion source 21 ionizes impurity gas and emits ionized ions towards the analyzer 22. The analyzer 22 allows only desired ones of the ions entering from the ion source 21 to pass therethrough as the ion beam IB towards the Q lens 23. The Q lens 23 converges the ion beam IB entering from the analyzer 22 and emits the converged ion beam IB towards the scanner 24. The scanner 24 scans the ion beam IB entering from the Q lens 23 in a direction perpendicular to a traveling direction of the ion beam IB. The parallel lens 25 collimates the ion beam IB scanned by the scanner 24 and emits the collimated ion beam IB towards the post-stage acceleration/deceleration electrode 26. The post-stage acceleration/deceleration electrode 26 accelerates or decelerates the ion beam IB entering from the parallel lens 25 and emits the accelerated or decelerated ion beam IB towards the energy filter 27. The energy filter 27 removes energy contamination from the ion beam IB entering from the post-stage acceleration/deceleration electrode 26 and emits the ion beam IB from which the energy contamination has been removed to a semiconductor substrate (a wafer) 5. The energy filter 27 may be an angular energy filter.

Figure 3:
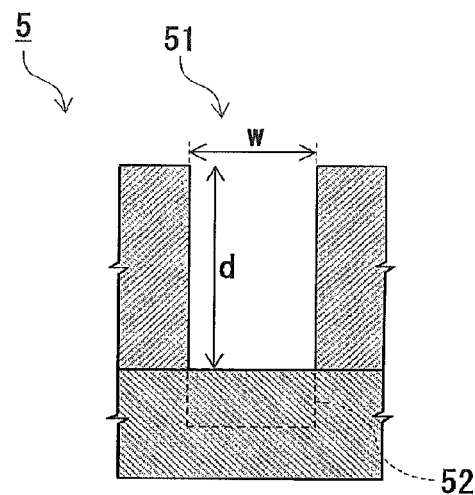
FIG. 3 is a schematic cross-sectional view of a semiconductor substrate into which ions are implanted with the ion implantation apparatus of FIG. 1.

FIG. 3 is a schematic cross-sectional view of the semiconductor substrate 5 into which ions are implanted by the ion implantation apparatus of FIG. 1. The semiconductor substrate 5 includes a concave portion 51 and an implantation region 52 that is located at the bottom of the concave portion 51.

The implantation part 2 is opposed to the concave portion 51 of the semiconductor substrate 5 of FIG. 3 and implants ions into the implantation region 52. The ions implanted into the implantation region 52 are ions included in the ion beam IB emitted from the energy filter 27.

The concave portion 51 is a slit or a via hole formed in a laminated film in a three-dimensional memory cell structure, for example. The implantation region 52 is a region located on the bottom of the slit or the via hole, in which a contact diffusion layer in a p-well or an n-well is to be formed, for example.

When the width and the depth of the concave portion 51 are assumed to be w and d, respectively, as shown in FIG. 3, an aspect ratio of the concave portion 51 can be represented by d/w. While the aspect ratio d/w of the concave portion 51 is not specifically limited, in the first embodiment, a high aspect ratio that is larger than 30 can be employed, for example.

(Measuring Part 3)

As shown in FIG. 1, the measuring part 3 is arranged at a second position P2 close to a first position P1 at which the semiconductor substrate 5 is arranged when ions are implanted into the implantation region 52. In FIG. 1, the first position P1 is a position opposed to the implantation part 2 in the traveling direction of the ion beam IB. The center of the semiconductor substrate 5 at the first position P1 may be coaxial with the center of the energy filter 27. In FIG. 1, the second position P2 is a close position to the first position P1 on the side (surroundings) D1 of the first position P1. The second position P2 is not limited to the close position to the first position P1 on the side D1 of the first position P1, so long as the ion beam IB is reachable thereto from the implantation part 2. For example, the second position P2 may be a close position to the first position P1 in the beam traveling direction (behind the first position P1).

Figure 4:
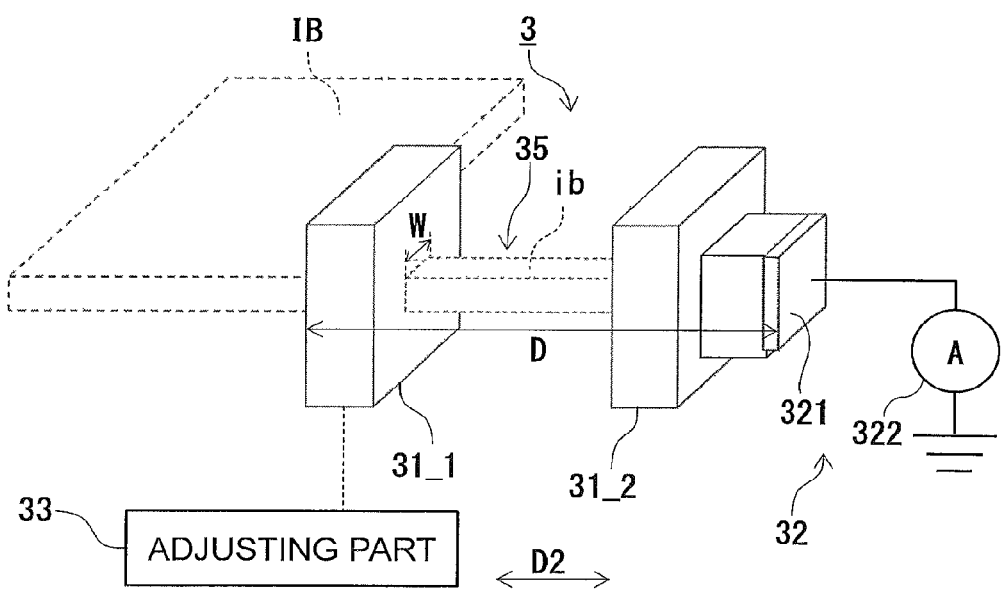
FIG. 4 is a schematic perspective view of a measuring part according to the first embodiment.

FIG. 4 is a schematic perspective view of the measuring part 3 according to the first embodiment.

The measuring part 3 measures an implantation amount of ions corresponding to the aspect ratio d/w of the concave portion 51 based on ions implanted thereto from the implantation part 2 at the second position P2.

As a specific configuration for measuring an implantation amount of ions corresponding to the aspect ratio d/w of the concave portion 51, the measuring part 3 includes two collimators (hereinafter, these collimators are also referred to as "first collimator 31_1" and "second collimator 31_2"), a Faraday cup 32 as a first measuring part, an adjusting part 33, and an introduction path 35, as shown in FIG. 4.

As shown in FIGS. 1 and 2, the first collimator 31_1 faces the implantation part 2. That is, the first collimator 31_1 is the most closest one of the collimators to the implantation part 2.

As shown in FIG. 4, an ion beam ib around an ion beam incident on the semiconductor substrate 5 in the ion beam IB emitted from the implantation part 2 is incident on the first collimator 31_1.

The introduction path 35 is a path of the ion beam ib in the measuring part 3. A starting end of the introduction path 35 is an incident region of the ion beam ib in the first collimator 31_1, and a terminal end of the introduction path 35 is an incident region of the ion beam ib in the Faraday cup 32. The frontage of the introduction path 35 is the width of the incident region of the ion beam ib in the first collimator 31_1, that is, a beam width W of the ion beam ib. The depth of the introduction path 35 is a distance D between the first collimator 31_1 and the Faraday cup 32.

The first collimator 31_1 collimates the ion beam ib incident thereon and emits the collimated ion beam ib towards the second collimator 31_2. The second collimator 31_2 further collimates the ion beam ib incident thereon from the first collimator 31_1 and emits the collimated ion beam ib towards the Faraday cup 32. In this manner, the ion beam ib is introduced into the Faraday cup 32 along the introduction path 35. The number of the collimators is not limited to two, but may be one or three or more.

The Faraday cup 32 includes a trapping electrode 321 and an ammeter 322 connected to the trapping electrode 321. The Faraday cup 32 may further include a secondary-electron suppression electrode. Ions included in the beam emitted from the second collimator 31_2 are implanted (detected) in the Faraday cup 32. The Faraday cup 32 outputs a current according to the number of ions implanted thereinto by the ammeter 322, to measure an implantation amount of ions.

The adjusting part 33 according to the first embodiment is an actuator that can move the collimators 31_1 and 31_2 in a beam-axis direction D2 between the implantation part 2 and the Faraday cup 32. The adjusting part 33 may include, for example, a motor and a rack gear that converts rotational motion of the motor to translational motion of the collimators 31_1 and 31_2.

The adjusting part 33 adjusts the implantation amount of ions in the Faraday cup 32 to an implantation amount corresponding to the aspect ratio d/w of the concave portion 51 in advance before measurement of the implantation amount. In order to adjust the implantation amount of ions to the implantation amount corresponding to the aspect ratio d/w of the concave portion 51, the adjusting part 3 adjusts the ratio of the frontage W and the depth D of the introduction path 35 so that the ratio corresponds to the aspect ratio d/w. Specifically, the adjusting part 33 adjusts a ratio D/W of the width W of the ion beam incident on the first collimator 31_1 and the distance D between the first collimator 31_1 and the Faraday cup 32 to match the aspect ratio d/w of the concave portion 51. In the following explanations, D/W is also described as an aspect ratio of the introduction path 35.

By making the aspect ratio D/W of the introduction path 35 match the aspect ratio d/w of the concave portion 51, the introduction path 35 can function similarly to the concave portion 51 for limiting the implantation angle of ions. Therefore, when the implantation amount of ions introduced from the introduction path 35 having the aspect ratio D/W adjusted to match (that is, correspond to) the aspect ratio d/w of the concave portion 51 is measured, an implantation amount of ions corresponding to the aspect ratio d/w of the concave portion 51 can be measured.

(Controller 4)

The controller 4 controls the implantation part 2 and the measuring part 3 based on the implantation amount of ions measured by the measuring part 3.

Specifically, the controller 4 executes control of stopping implantation of ions by the implantation part 2, when an accumulated amount of the implantation amount of ions measured by the measuring part 3 has reached a predetermined amount according to an accumulated amount of the implantation amount of ions of the implantation region 52 as a target (that is, a target accumulation amount). In the first embodiment, the control of stopping the implantation of ions is control of simultaneously stopping both implantation of ions into the implantation region 52 and implantation of ions into the measuring part 3 (the second position). When executing the control of stopping the implantation of ions, the controller 4 also executes control of stopping the measurement of the implantation amount of ions by the measuring part 3.

The predetermined amount may be set in a recipe that defines a condition for processing the semiconductor substrate 5 by a semiconductor manufacturing apparatus. Further, the most appropriate accumulation amount at which it can be regarded that implantation of ions into the implantation region 52 can be performed without excess or deficiency may be set as the predetermined amount based on an experiment or a simulation performed in advance for examining a correspondence relation between the accumulated amount of the implantation amount of ions into the measuring part 3 and the accumulated amount of the implantation amount of ions into the implantation region 52. The controller 4 may control the entire operation of the ion implantation apparatus 1.

A profiler crossing the first position P1 may be provided in order to measure an implantation angle such as deviation of a beam axis or a divergence angle of the beam before implantation of ions into the implantation region 52. In this case, the ion implantation apparatus 1 may control the implantation angle based on the measurement result of the profiler. For example, control of the deviation of the beam axis or the divergence angle of the beam can be achieved by adjusting a lens of an electrostatic filter, a beam current, and a beam diameter. According to the ion implantation apparatus 1 according to the first embodiment, it is possible to make the aspect ratio D/W of the introduction path 35 match the aspect ratio d/w of the concave portion 51 by the adjusting part 33. The measuring part 3 having the aspect ratio D/W of the introduction path 35 that matches the aspect ratio d/w of the concave portion 51 accurately simulates the implantation angle in the actual concave portion 51. Specifically, ions implanted at the same implantation angle as ions implanted into the implantation region 52 are measured with the Faraday cup 32. In other words, only ions corresponding to the deviation of the beam axis or the divergence angle that is permissible for the concave portion 51 are detected with the Faraday cup 32.

Therefore, the measuring part 3 can measure the implantation amount of ions on which the implantation amount of ions actually implanted into the implantation region 52 is accurately reflected.

In this manner, according to the ion implantation apparatus 1 according to the first embodiment, the implantation amount of ions can be simply and accurately measured without requiring complicated control of the implantation angle, by measuring the implantation amount of ions corresponding to the aspect ratio d/w of the concave portion 51.

Further, because the implantation amount of ions into the implantation region 52 is accurately reflected on the implantation amount of ions measured by the measuring part 3, the implantation amount of ions can be accurately measured even when the precision of the implantation angle is varied among models of the implantation part 2.

(Semiconductor Manufacturing Method)

Figure 5:
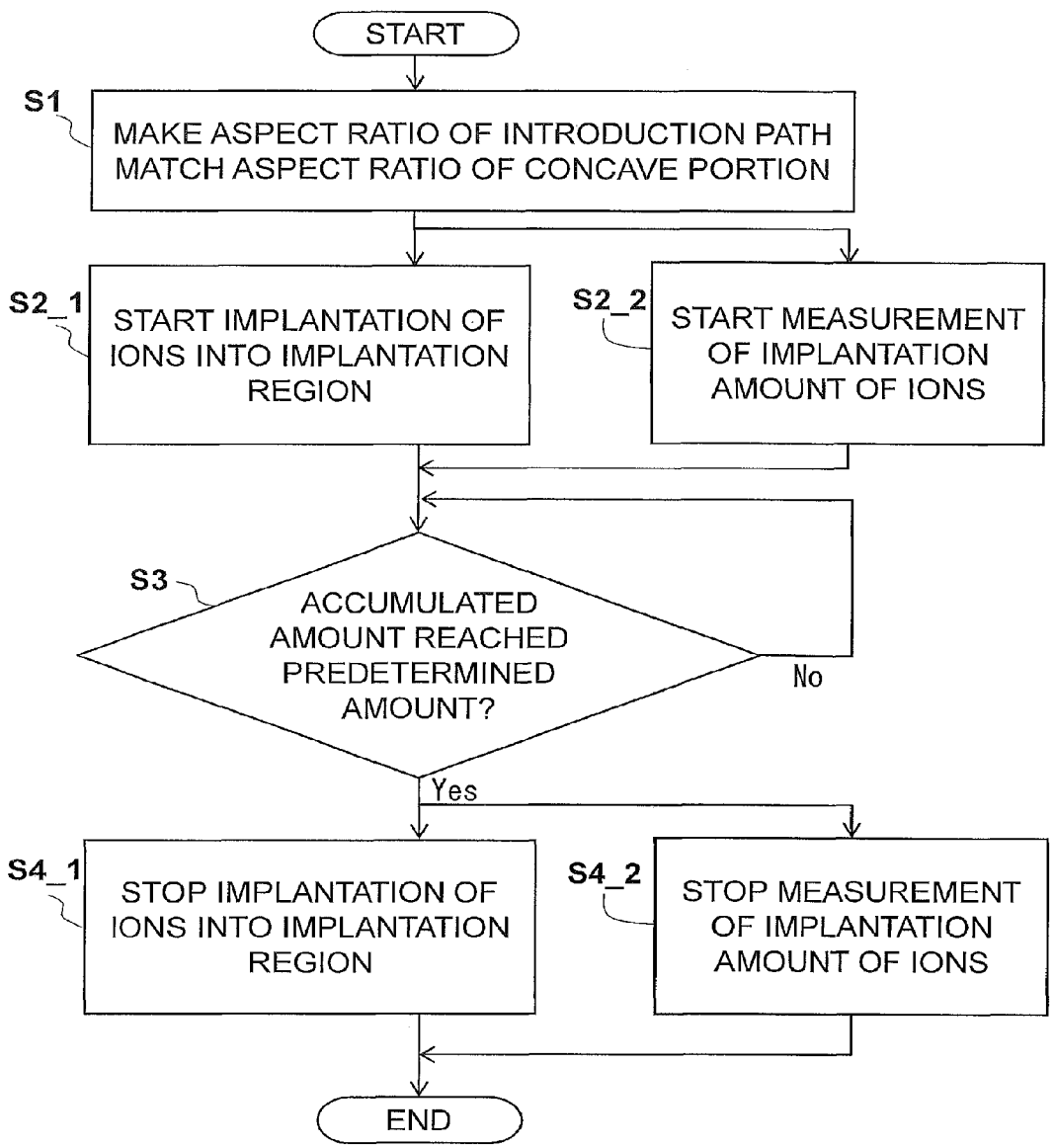
FIG. 5 is a flowchart of a semiconductor manufacturing method according to the first embodiment.

A semiconductor manufacturing method to which the ion implantation apparatus 1 of FIG. 1 is applied is described next. FIG. 5 is a flowchart of a semiconductor manufacturing method according to the first embodiment.

It is assumed that the semiconductor substrate 5 is arranged at the first position P1 in an initial state of FIG. 5. The semiconductor substrate 5 may be arranged at the first position P1 by an automatic transporting mechanism (not shown), for example.

From the initial state, the adjusting part 33 is controlled by the controller 4 to make the aspect ratio D/W of the introduction path 35 match the aspect ratio d/w of the concave portion 51 based on information on the aspect ratio d/w of the concave portion 51 that has been acquired in advance (Step S1).

The implantation part 2 is then controlled by the controller 4 to start implantation of ions into the implantation region 52 (Step S2_1). At this time, the measuring part 3 is controlled by the controller 4 to start measurement of an implantation amount of ions (Step S2_2).

In other words, the measuring part 3 measures the implantation amount of ions corresponding to the aspect ratio d/w of the concave portion 51 at the second position P2 when ions are implanted into the implantation region 52.

Subsequently, the controller 4 determines whether an accumulated amount of the implantation amount of ions measured by the measuring part 3 has reached a predetermined amount (Step S3). When the accumulated amount has reached the predetermined amount (Step S3: Yes), the controller 4 controls the implantation part 2 to stop the implantation of ions (Step S4_1). The controller 4 also controls the measuring part 3 to stop the measurement of the implantation amount of ions (Step S4_2). On the other hand, when the accumulated amount has not reached the predetermined amount (Step S3: No), the controller 4 repeats the determination (Step S3).

According to the semiconductor manufacturing method according to the first embodiment, an implantation amount of ions can be simply and accurately measured by making the aspect ratio D/W of the introduction path 35 match the aspect ratio d/w of the concave portion 51. Consequently, a semiconductor apparatus (for example, a three-dimensional memory) exerting a satisfactory performance can be manufactured with a stable yield.

Second Embodiment

Figure 6:
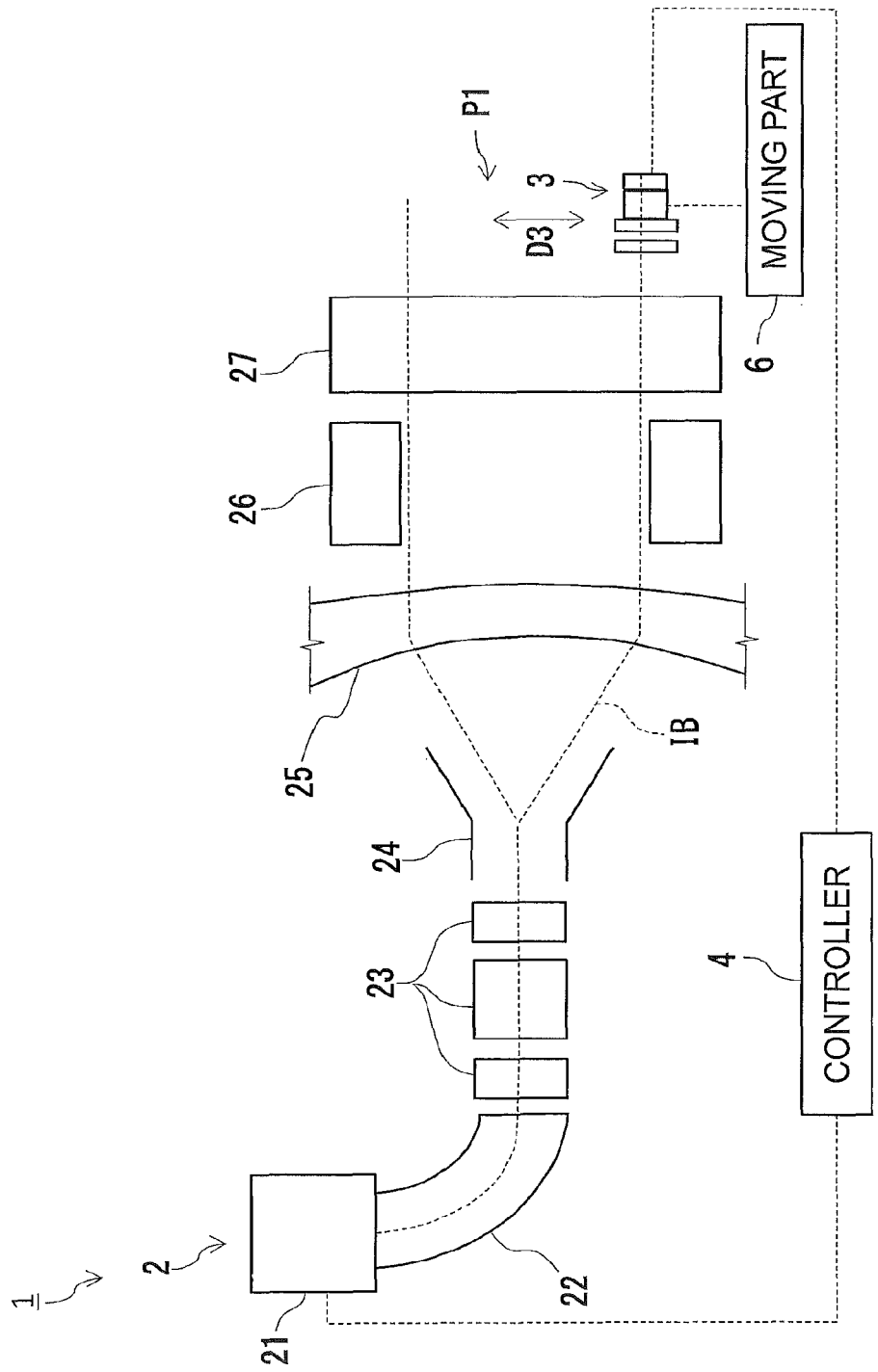
FIG. 6 is a schematic plan view of an ion implantation apparatus according to a second embodiment.

An embodiment in which an implantation amount corresponding to the aspect ratio is measured by using a collimator before ions are implanted into an implantation region is described next as a second embodiment. In the second embodiment, constituent elements corresponding to those of the first embodiment are denoted by like reference numerals and redundant explanations thereof will be omitted. FIG. 6 is a schematic plan view of an ion implantation apparatus according to the second embodiment.

As shown in FIG. 6, the ion implantation apparatus 1 according to the second embodiment includes a moving part 6 that moves the measuring part 3. The moving part 6 can move the measuring part 3 in a direction D3 crossing the first position P1. The moving part 6 may include, for example, a motor and a rack gear that converts rotational motion of the motor to translational motion in the direction D3 crossing the first position P1. The controller 4 may control the operation of the moving part 6.

The moving part 6 moves the measuring part 3 to the first position P1 before the semiconductor substrate 5 is arranged at the first position P1, that is, before implantation of ions into the implantation region 52. The measuring part 3 measures the implantation amount of ions corresponding to the aspect ratio d/w of the concave portion 51 at the first position P1 in advance, before ions are implanted into the implantation region 52.

Figure 7:
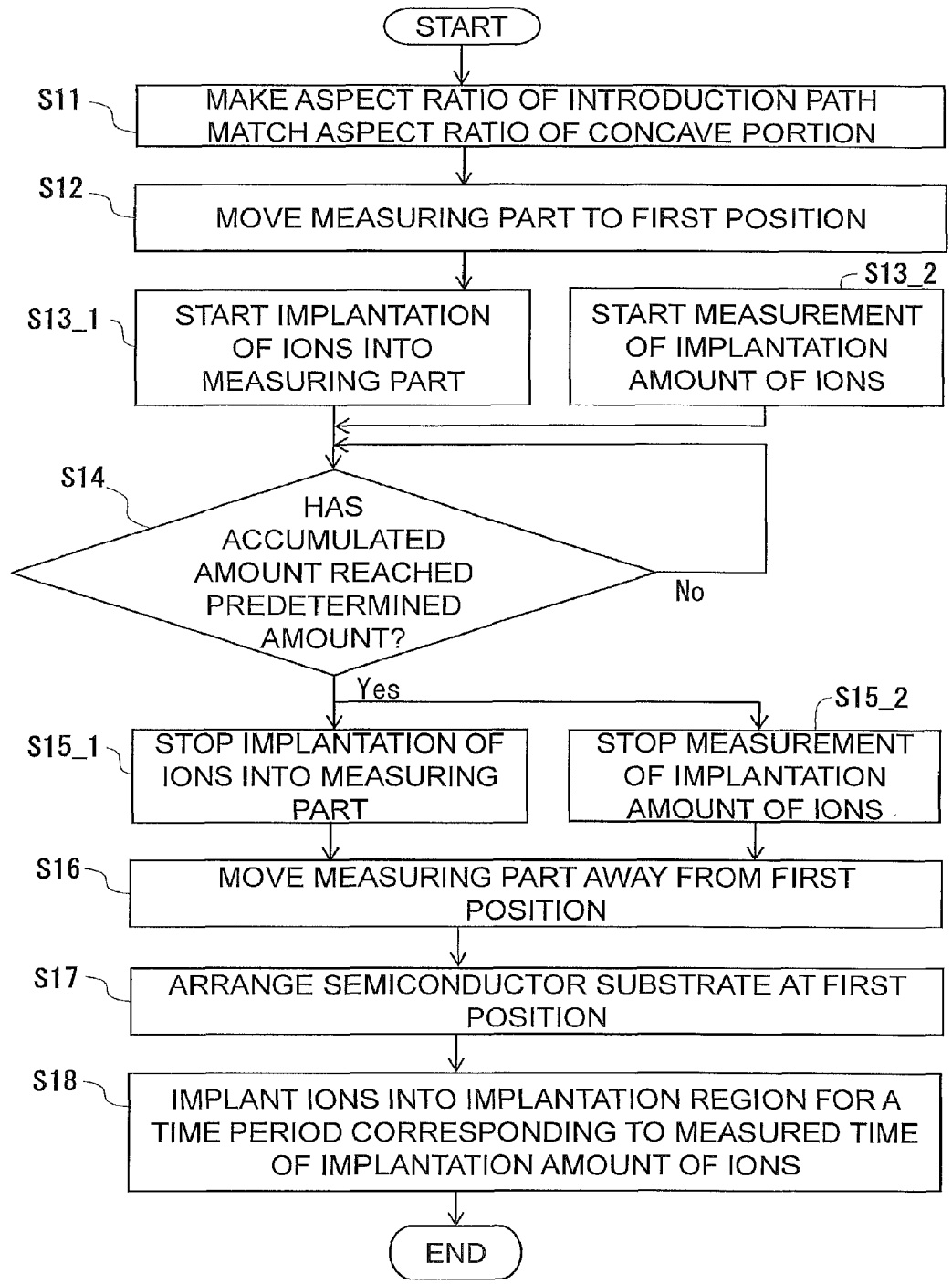
FIG. 7 is a flowchart of a semiconductor manufacturing method according to the second embodiment.

Next, a semiconductor manufacturing method to which the ion implantation apparatus 1 of FIG. 6 is applied is described. FIG. 7 is a flowchart of a semiconductor manufacturing method according to the second embodiment.

It is assumed that the semiconductor substrate 5 is not arranged at the first position P1 in an initial state of FIG. 7. It is also assumed that the measuring part 3 is retracted to the side of the first position P1 in the initial state of FIG. 7.

From the initial state, the adjusting part 33 makes the aspect ratio D/W of the introduction path 35 match the aspect ratio d/w of the concave portion 51 similarly to Step S1 in FIG. 5
(Step S11).

The moving part 6 then moves the measuring part 3 to the first position P1 (Step S12). That is, the measuring part 3 is moved to the first position P1 before the semiconductor substrate 5 is arranged at the first position P1.

The implantation part 2 is then controlled by the controller 4 to start implantation of ions into the measuring part 3 (Step S13_1). At this time, the measuring part 3 is controlled by the controller 4 to start measurement of the implantation amount of ions (Step S13_2). The controller 4 also records a start time of the measurement of the implantation amount of ions in a memory. The memory may be a storage region of the controller 4 or a storage device outside the controller 4.

Subsequently, the controller 4 determines whether an accumulated amount of the implantation amount of ions has reached a predetermined amount similarly to Step S3 in FIG. 5 (Step S14). When the accumulated amount has reached the predetermined amount (Step S14: Yes), the controller 4 controls the implantation part 2 to stop the implantation of ions to the measuring part 3 (the first position) (Step S15_1). The controller 4 also controls the measuring part 3 to stop the measurement of the implantation amount of ions (Step S15_2). At this time, the controller 4 records an end time of the measurement of the implantation amount of ions in the memory.

On the other hand, when the accumulated amount has not reached the predetermined amount (Step S14: No), the controller 4 repeats the determination (Step S14).

After the measurement of the implantation amount of ions has been terminated, the moving part 6 moves the measuring part 3 away from the first position P1 (Step S16).

Subsequently, the semiconductor substrate 5 is arranged at the first position P1 by an automatic transporting mechanism (not shown) (Step S17).

The controller 4 then calculates the difference between the start time and the end time of the measurement of the implantation amount of ions that have been recorded in the memory as a measured time (a required time) of the implantation amount of ions. Subsequently, the controller 4 controls the implantation part 2 to implant ions into the implantation region 52 for a time period corresponding to the measured time of the implantation amount of ions (Step S18). As the time period corresponding to the measured time of the implantation amount of ions, the most appropriate time period in which it can be regarded that implantation of ions can be performed without excess or deficiency may be set, based on an experiment or a simulation performed in advance for examining a correspondence relation among the measured time of the implantation amount of ions, a time period of the implantation of ions into the implantation region 52, and the accumulated amount of the implantation amount of ions into the implantation region 52.

According to the second embodiment, an implantation amount of ions can be measured at the first position P1 at which ion implantation into the implantation region 52 is actually performed. Therefore, the implantation amount of ions can be measured more accurately.

Third Embodiment

Figure 8:
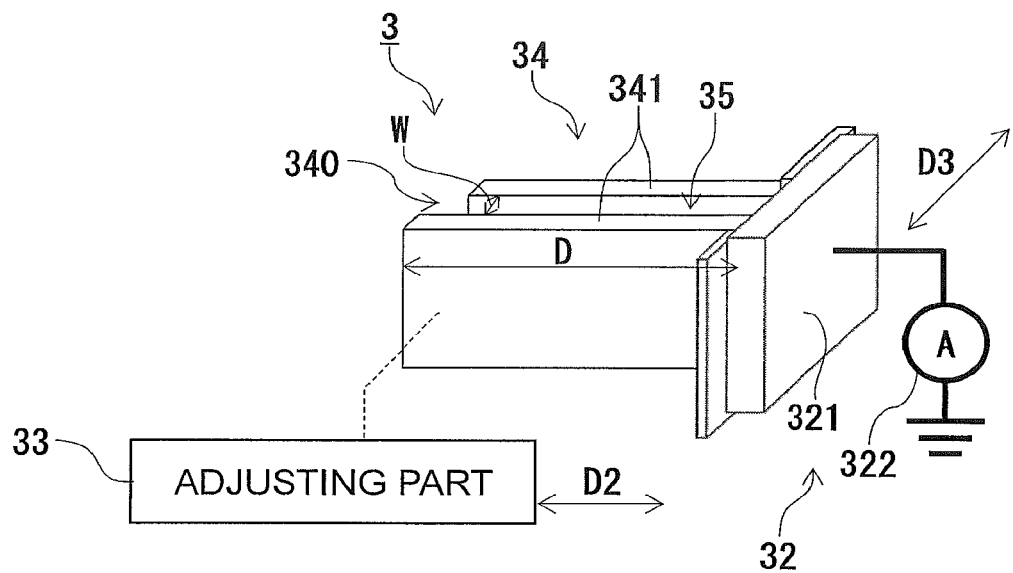
FIG. 8 is a perspective view of a measuring part according to a third embodiment.

An embodiment of an ion implantation apparatus that measures an implantation amount corresponding to the aspect ratio by using a diaphragm is described next as a third embodiment. In the third embodiment, constituent elements corresponding to those of the first embodiment are denoted by like reference numerals and redundant explanations thereof will be omitted. FIG. 8 is a perspective view of the measuring part 3 according to the third embodiment.

As shown in FIG. 8, the measuring part 3 according to the third embodiment includes a diaphragm 34 in place of a collimator. The diaphragm 34 includes a pair of sidewalls 341 arranged at a position on the incident side of the ion beam IB with respect to the Faraday cup 32. Both the sidewalls 341 extend along the beam-axis direction D2 from the Faraday cup 32 towards the implantation part 2. In the following explanations, a dimension D of the sidewalls 341 in the beam-axis direction D2 is also described as the entire length of the diaphragm 34. Both the sidewalls 341 are arranged with a gap W therebetween (hereinafter, also "aperture width of the diaphragm 34") extending in the beam-scanning direction D3 perpendicular to the beam-axis direction D2.

The diaphragm 34 allows ions having an implantation angle within an angular range corresponding to the aperture width W to reach the Faraday cup 32 through an aperture 340. In other words, the diaphragm 34 allows ions of an implantation amount corresponding to the aperture width W to be implanted into the Faraday cup 32.

The introduction path 35 according to the third embodiment is a space between both the sidewalls 341 of the diaphragm 34. The frontage of the introduction path 35 is the aperture width W of the diaphragm 34. The depth of the introduction path 35 is the entire length D of the diaphragm 34. The aspect ratio of the introduction path 35 is the ratio D/W of the aperture width W and the entire length D of the diaphragm 34.

The adjusting part 33 according to the third embodiment is an actuator that can move the sidewalls 341 in the beam-scanning direction D3. The adjusting part 33 may include, for example, a motor and a rack gear that converts rotational motion of the motor to translational motion of the sidewalls 341.

The adjusting part 33 adjusts the aperture width W of the diaphragm 34 by moving both the sidewalls 341 in the beam-scanning direction D3. The adjusting part 33 adjusts the aperture width of the diaphragm 34 to make the aspect ratio D/W of the introduction path 35 match the aspect ratio d/w of the concave portion 51.

By making the aspect ratio D/W of the introduction path 35 match the aspect ratio d/w of the concave portion 51, the diaphragm 34 allows a portion of ions emitted from the implantation part 2, corresponding to the aspect ratio d/w, to reach the Faraday cup 32.

Therefore, according to the third embodiment, an implantation amount of ions can be adjusted to an implantation amount corresponding to the aspect ratio d/w of the concave portion 51 in advance similarly to the first embodiment, and hence the implantation amount of ions can be measured simply and accurately.

Fourth Embodiment

Figure 9:
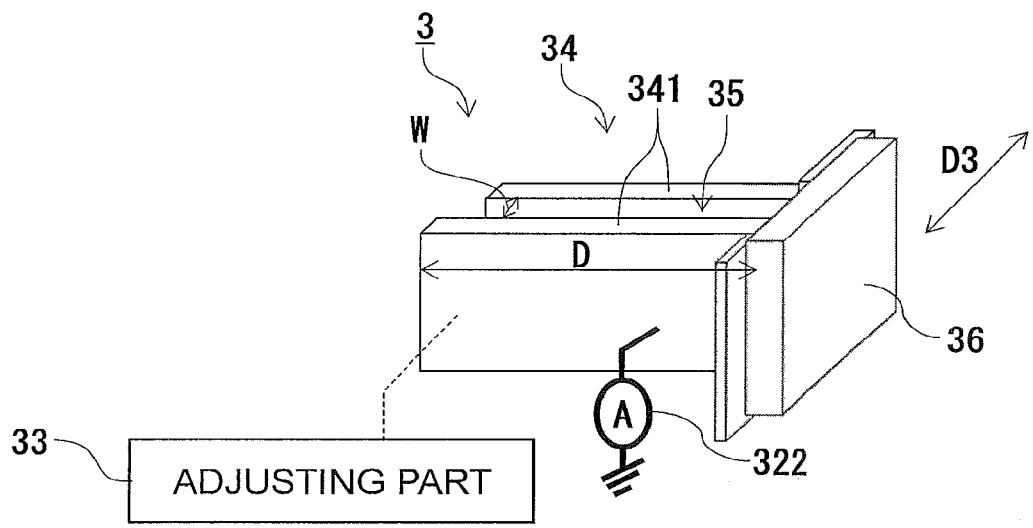
FIG. 9 is a perspective view of a measuring part according to a fourth embodiment.

An embodiment in which the diaphragm and the Faraday cup are formed by the same element is described next as a fourth embodiment. In the fourth embodiment, constituent elements corresponding to those of the third embodiment are denoted by like reference numerals and redundant explanations thereof will be omitted. FIG. 9 is a perspective view of a measuring part according to the fourth embodiment.

As shown in FIG. 9, the diaphragm 34 according to the fourth embodiment is the same in shape as that according to the third embodiment, but is different in that it also functions as a Faraday cup 34.

The Faraday cup 34 according to the fourth embodiment measures an implantation amount of ions having a large implantation angle that are deviated from the Faraday cup 32 according to the third embodiment. The amount of ions that are deviated from the implantation region 52 and are incident on an inner side face of the concave portion 51 is reflected on the implantation amount of ions measured in the fourth embodiment. When a correspondence relation between the amount of ions on the inner side face of the concave portion 51 and the implantation amount into the implantation region 52 is known, it is possible to estimate an accumulation amount of the implantation amount of ions into the implantation region 52 based on an accumulated amount of the implantation amount of ions measured in the fourth embodiment. In this case, implantation of ions into the implantation region 52 is stopped at a point in time at which the estimated accumulation amount of the implantation amount of ions into the implantation region 52 has reached a predetermined amount. In this manner, ions can be implanted into the implantation region 52 without excess or deficiency.

A rear wall 36 crossing the sidewalls 341 perpendicularly thereto may be a trapping electrode of the Faraday cup or may not have a function of trapping ions.

According to the fourth embodiment, it is possible to increase a degree of freedom in design of the arrangement of the Faraday cup.

Fifth Embodiment

Figure 10:
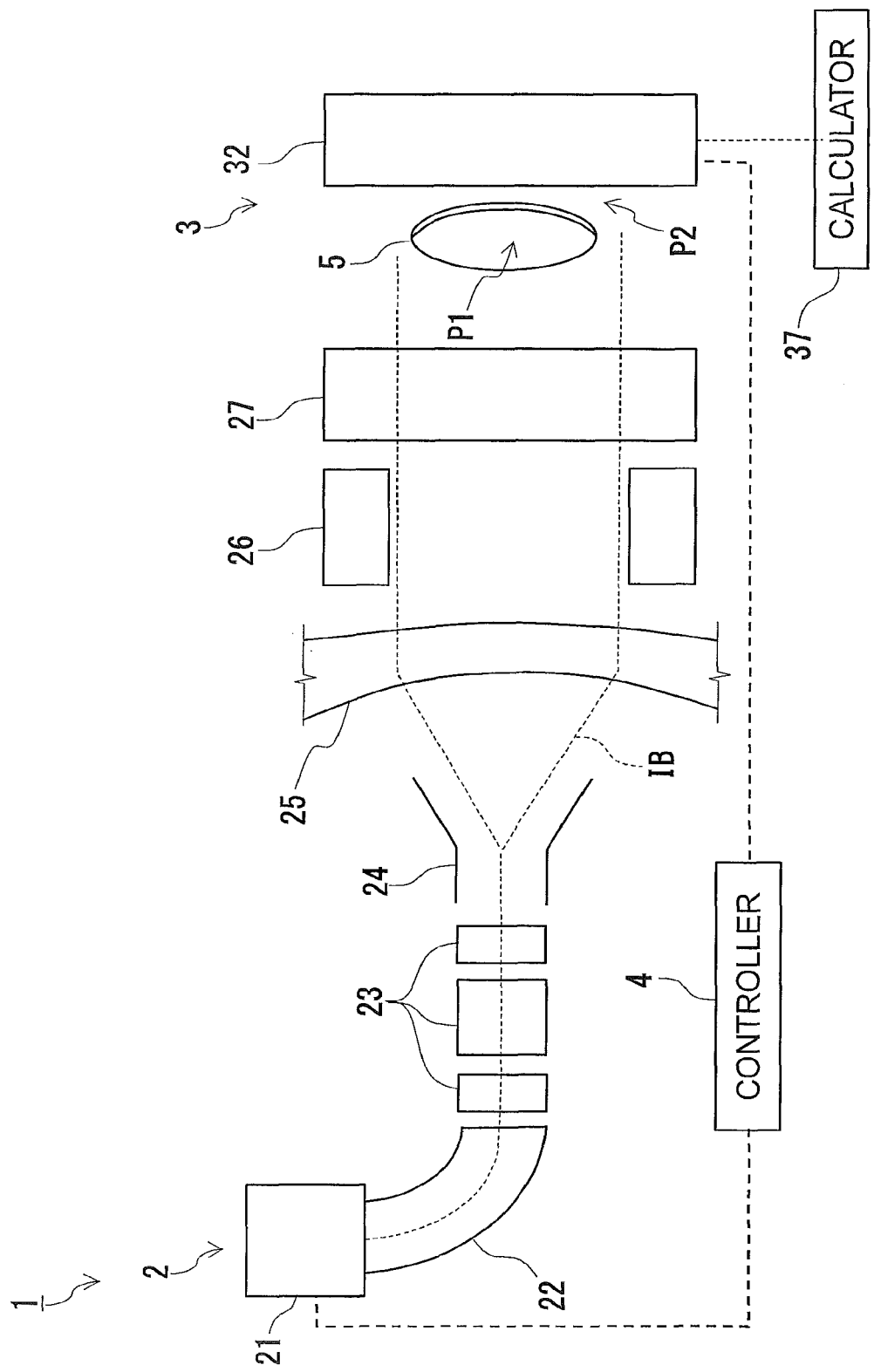
FIG. 10 is a schematic plan view of an ion implantation apparatus according to a fifth embodiment.

Next, a fifth embodiment is described in which an implantation amount of ions is measured by two steps, that is, a first-step measurement that does not consider the aspect ratio of the concave portion and a second-step measurement that considers the aspect ratio of the concave portion. In the fifth embodiment, constituent elements corresponding to those of the first embodiment are denoted by like reference numerals and redundant explanations thereof will be omitted. FIG. 10 is a schematic plan view of an ion implantation apparatus according to the fifth embodiment.

In the first to fourth embodiments, an implantation amount of ions into the Faraday cup 32 is controlled in advance by making the aspect ratio D/W of the introduction path 35 match the aspect ratio d/w of the concave portion 51. In the contrary, in the fifth embodiment, the implantation amount of ions is not controlled in advance. Instead, the ion implantation apparatus 1 according to the fifth embodiment measures an implantation amount of ions with the Faraday cup 32 (a second measuring part) in a first step, and thereafter calculates (measures) an implantation amount of ions corresponding to the aspect ratio d/w of the concave portion 51 based on the implantation amount of ions measured with the Faraday cup 32 in a second step.

Specifically, the measuring part 3 according to the fifth embodiment includes a calculator 37 that calculates an implantation amount of ions corresponding to the aspect ratio d/w of the concave portion 51 based on an implantation amount of ions measured with the Faraday cup 32. The calculator 37 calculates an implantation amount at an implantation angle within an angular range corresponding to the aspect ratio d/w of the concave portion 51, of the implantation amount of ions measured with the Faraday cup 32. In other words, the calculator 37 calculates an implantation amount within a measured region of the Faraday cup 32, corresponding to the aspect ratio d/w of the concave portion 51 (a second measured region in a first measured region), of the implantation amount of ions measured with the Faraday cup 32 (the first measured region).

The implantation angle within the angular range corresponding to the aspect ratio d/w of the concave portion 51 is an implantation angle within an angular range in which ions can be implanted into the implantation region 52 located at the bottom of the concave portion 51. The calculator 37 and the controller 4 may be formed by the same element.

Figure 11:
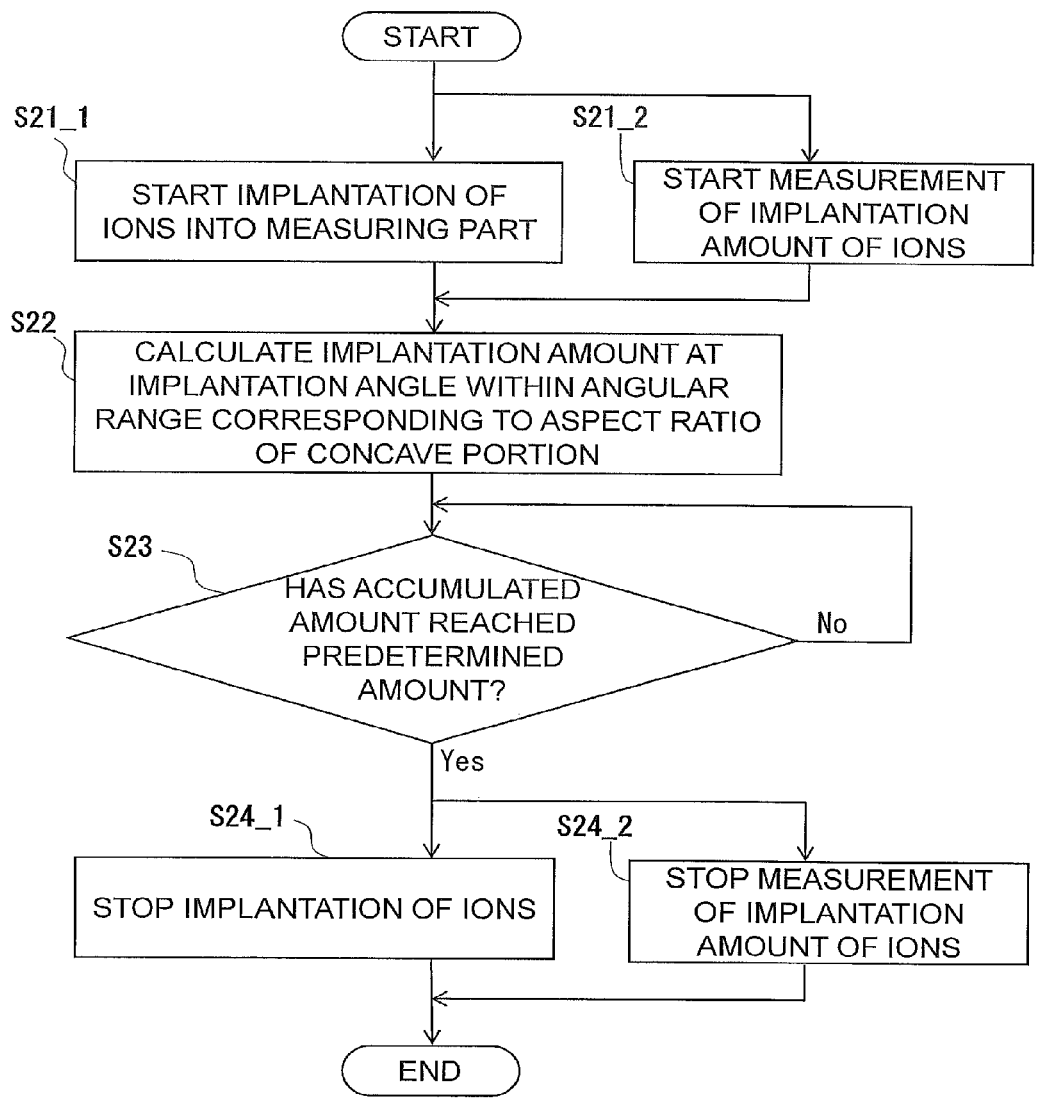
FIG. 11 is a flowchart of a semiconductor manufacturing method according to the fifth embodiment.

Next, a semiconductor manufacturing method to which the ion implantation apparatus 1 of FIG. 10 is applied is described. FIG. 11 is a flowchart of a semiconductor manufacturing method according to the fifth embodiment.

It is assumed that the semiconductor substrate 5 is arranged at the first position P1 in an initial state of FIG. 11.

From the initial state, the implantation part 2 is controlled by the controller 4 to start implantation of ions into the measuring part 3 (Step S21_1). At this time, the Faraday cup 32 of the measuring part 3 is controlled by the controller 4 to start measurement of an implantation amount of ions (Step S21_2).

The calculator 37 then calculates the implantation amount of ions at an implantation angle within the angular range corresponding to the aspect ratio d/w of the concave portion 51, that is, the implantation amount of ions within the measured region corresponding to the aspect ratio d/w, of the implantation amount of ions measured with the Faraday cup 32 (Step S22).

Figure 12B:
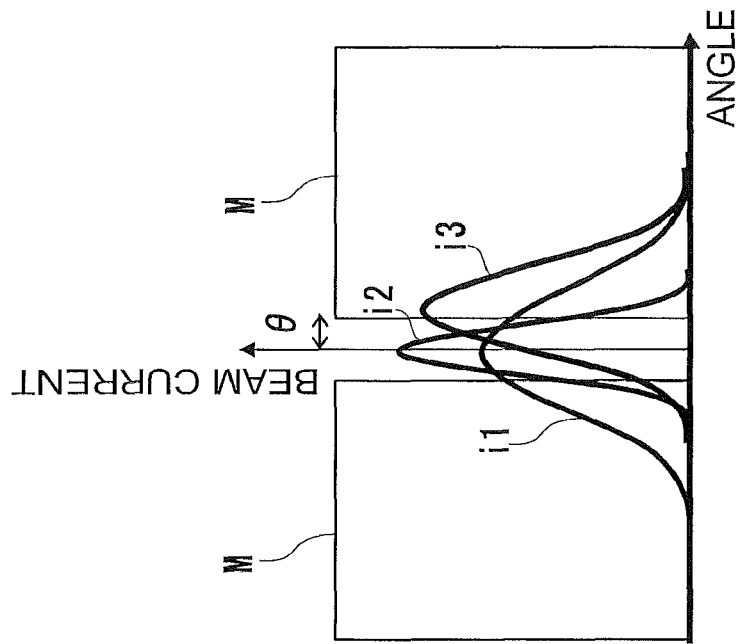
FIG. 12B is a schematic diagram showing the implantation amount of ions into the Faraday cup in a case where the aspect ratio of the concave portion is high in the fifth embodiment.
Figure 12A:
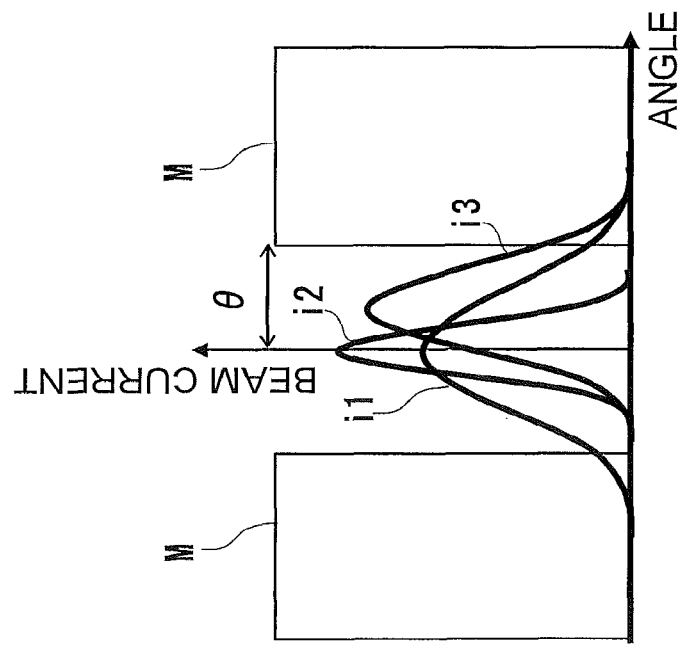
FIG. 12A is a schematic diagram showing an implantation amount of ions into a Faraday cup in a case where an aspect ratio of a concave portion is low in the fifth embodiment.

FIG. 12A is a schematic diagram showing an implantation amount of ions into the Faraday cup 32 in a case where the aspect ratio d/w of the concave portion 51 is low in the fifth embodiment. FIG. 12B is a schematic diagram showing the implantation amount of ions into the Faraday cup 32 in a case where the aspect ratio d/w of the concave portion 51 is high in the fifth embodiment. In FIGS. 12A and 12B, the horizontal axis represents a spread angle of the ion beam IB with respect to the beam axis as a center (0°), and the vertical axis represents a beam current output in the Faraday cup 32. FIGS. 12A and 12B show a beam current i1 in a case where the divergence angle of the ion beam IB is large and a beam current i2 in a case where the divergence angle is small, as examples. A beam current i3 considering axis deviation of the ion beam IB is also shown in FIGS. 12A and 12B.

As shown in FIGS. 12A and 12B, the beam current has a maximum value at the spread angle of 0°, and reduces as the spread angle increases. Further, as shown in FIGS. 12A and 12B, an angular range θ corresponding to the aspect ratio d/w is narrower when the aspect ratio d/w is high than when the aspect ratio d/w is low.

Therefore, the calculator 37 calculates the beam current belonging to the narrower angular range θ when the aspect ratio d/w is high than when the aspect ratio d/w is low, as the implantation amount of ions corresponding to the aspect ratio d/w of the concave portion 51. The calculator 37 may set a virtual mask M in an angular range deviated from the angular range θ corresponding to the aspect ratio d/w, in the calculation of the implantation amount of ions.

Subsequently, the controller 4 determines whether the calculated accumulated amount of the implantation amount of ions has reached a predetermined amount (Step S23). When the accumulated amount has reached the predetermined amount (Step S23: Yes), the controller 4 controls the implantation part 2 to stop the implantation of ions (Step S24_1). At this time, the controller 4 controls the measuring part 3 to stop the measurement of the implantation amount of ions (Step S24_2).

Meanwhile, when the accumulated amount has not reached the predetermined amount (Step S23: No), the controller 4 repeats the determination (Step S23).

According to the fifth embodiment, it is possible to measure an implantation amount of ions accurately with a reduced cost by making a small change in design (for example, changing software) to an existing ion implantation apparatus.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. An ion implantation apparatus comprising:
an implantation part implanting ions into an implantation region located at a bottom of a concave portion formed in a laminated film provided on a semiconductor substrate;
a measuring part measuring an amount of detected ions corresponding to an aspect ratio of the concave portion based on ions emitted from the implantation part thereinto, at a first position at which the semiconductor substrate is arranged when the ions are implanted into the implantation region or a second position close to the first position; and
a controller controlling the implantation part to stop emission of the ions into the measuring part when an accumulated amount of the amount of detected ions has reached a predetermined amount according to a target accumulation amount of the implantation region, wherein
the measuring part comprises:
an introduction path introducing ions from the implantation part, an adjusting part adjusting a ratio of a frontage and a depth of the introduction path to correspond to the aspect ratio, and
a measuring unit measuring an amount of detected ions introduced from the introduction path comprising the adjusted ratio of the frontage and the depth, to measure the amount of detected ions corresponding to the aspect ratio of the concave portions.

2. The apparatus of claim 1, wherein the measuring part is arranged at the second position and measures an amount of detected ions corresponding to the aspect ratio of the concave portion at the second position when ions are implanted into the implantation region.

3. The apparatus of claim 1, wherein the measuring part is moved to the first position before the semiconductor substrate is arranged at the first position, and measures an amount of detected ions corresponding to the aspect ratio of the concave portion at the first position before ions are implanted into the implantation region.

4. The apparatus of claim 1, wherein
the measuring part comprises at least one collimator arranged between the implantation part and the measuring unit, and
the frontage of the introduction path is a width of an incident region of ions in a first collimator that faces the implantation part out of the at least one collimator, and the depth of the introduction path is a distance between the first collimator and the measuring unit.

5. The apparatus of claim 2, wherein
the measuring part comprises at least one collimator arranged between the implantation part and the measuring unit, and
the frontage of the introduction path is a width of an incident region of ions in a first collimator that faces the implantation part out of the at least one collimator, and the depth of the introduction path is a distance between the first collimator and the measuring unit.

6. The apparatus of claim 3, wherein
the measuring part comprises at least one collimator arranged between the implantation part and the measuring unit, and
the frontage of the introduction path is a width of an incident region of ions in a first collimator that faces the implantation part out of the at least one collimator, and the depth of the introduction path is a distance between the first collimator and the measuring unit.

7. The apparatus of claim 4, wherein the adjusting part makes a ratio of the width of the incident region in the first collimator and the distance between the first collimator and the measuring unit match the aspect ratio.

8. The apparatus of claim 5, wherein the adjusting part makes a ratio of the width of the incident region in the first collimator and the distance between the first collimator and the measuring unit match the aspect ratio.

9. The apparatus of claim 6, wherein the adjusting part makes a ratio of the width of the incident region in the first collimator and the distance between the first collimator and the measuring unit match the aspect ratio.

10. The apparatus of claim 1, wherein
the measuring part comprises a diaphragm allowing ions of an amount corresponding to a width of an aperture to be detected in the measuring unit through the aperture, and
the frontage of the introduction path is the width of the aperture, and the depth of the introduction path is an entire length of the diaphragm.

11. The apparatus of claim 10, wherein the diaphragm and the measuring unit are formed by a same element.

12. A semiconductor manufacturing method comprising:
implanting ions into an implantation region located at a bottom of a concave portion formed in a laminated film provided on a semiconductor substrate;
measuring an amount of detected ions corresponding to an aspect ratio of the concave portion at a first position at which the semiconductor substrate is arranged when ions are implanted into the implantation region or a second position close to the first position, based on the ions detected in the first position or the second position; and
stopping emission of the ions into the first position or the second position when an accumulated amount of the amount of detected ions has reached a predetermined amount according to a target accumulation amount of the implantation region, wherein
the measuring the amount of detected ions comprises:
adjusting a ratio of a frontage and a depth of an introduction path introducing ions to correspond to the aspect ratio, and
measuring an amount of detected ions introduced from the introduction path comprising the adjusted ratio of the frontage and the depth, to measure the amount of detected ions corresponding to the aspect ratio of the concave portions.

13. The method of claim 12, wherein the amount of detected ions corresponding to the aspect ratio of the concave portion is measured at the second position when ions are implanted into the implantation region.

14. The method of claim 12, wherein the amount of detected ions corresponding to the aspect ratio of the concave portion is measured at the first position before ions are implanted into the implantation region.

15. The method of claim 12, wherein an amount of detected ions is measured in a first measured region, and an amount of detected ions measured in a second measured region of the first measured region, which corresponds to the aspect ratio of the concave portion, is calculated as an amount of detected ions corresponding to the aspect ratio of the concave portion.

* * * * *